(12) United States Patent
Liu (10) Patent No.: US 10,930,802 B2
(45) Date of Patent: Feb. 23, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Chanyuan Liu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/970,536

(22) Filed: May 3, 2018

(65) Prior Publication Data
US 2019/0341505 A1    Nov. 7, 2019

(51) Int. Cl.
| H01L 31/0203 | (2014.01) |
|---|---|
| H01L 31/02 | (2006.01) |
| H01L 31/18 | (2006.01) |
| H01L 31/173 | (2006.01) |
| H01L 31/0232 | (2014.01) |
| H01L 25/16 | (2006.01) |
| H01L 23/31 | (2006.01) |
| H01L 21/56 | (2006.01) |

(52) U.S. Cl.
CPC .......... *H01L 31/0203* (2013.01); *H01L 21/56* (2013.01); *H01L 23/3114* (2013.01); *H01L 23/3121* (2013.01); *H01L 25/167* (2013.01); *H01L 31/02002* (2013.01); *H01L 31/0232* (2013.01); *H01L 31/173* (2013.01); *H01L 31/18* (2013.01)

(58) Field of Classification Search
CPC ... H01L 31/18; H01L 31/173; H01L 31/0203; H01L 31/0232; H01L 31/02002
See application file for complete search history.

(56) References Cited

U.S. PATENT DOCUMENTS

| 6,252,350 | B1* | 6/2001 | Alvarez | G09F 13/22 257/79 |
|---|---|---|---|---|
| 7,755,029 | B2 | 7/2010 | Tang et al. | |
| 8,779,361 | B2 | 7/2014 | Costello et al. | |
| 2006/0243990 | A1* | 11/2006 | Suzuki | H01L 25/167 257/81 |
| 2007/0018123 | A1* | 1/2007 | Sano | G01V 8/12 250/551 |
| 2013/0249411 | A1* | 9/2013 | Takahashi | H05B 33/04 315/158 |
| 2015/0028359 | A1* | 1/2015 | Tu | H01L 31/173 257/82 |
| 2015/0060905 | A1* | 3/2015 | Nam | H01L 33/60 257/89 |
| 2015/0207016 | A1 | 7/2015 | Tharumalingam et al. | |
| 2017/0122501 | A1* | 5/2017 | Chung | F21V 3/02 |
| 2018/0090466 | A1* | 3/2018 | Hung | H01L 23/16 |

* cited by examiner

*Primary Examiner* — Ahmed N Sefer
(74) *Attorney, Agent, or Firm* — Foley & Lardner LLP (57) ABSTRACT

A semiconductor device package includes a substrate, a first encapsulant and a second encapsulant. The substrate has an optical region and a surface-mount technology (SMT) device region. The first encapsulant includes a first portion disposed on the optical region and covers the optical region and a second portion disposed on the SMT device region and covers the SMT device region. The second encapsulant is disposed on the substrate and covers at least a portion of the second portion of the first encapsulant and a portion of the first portion of the first encapsulant.

12 Claims, 11 Drawing Sheets

SEMICONDUCTOR DEVICE PACKAGE AND METHOD OF MANUFACTURING THE SAME

BACKGROUND

1. Technical Field

The present disclosure relates to a semiconductor device package, and to a semiconductor device package including one or more light emitting components.

2. Description of the Related Art

An optical module includes a light emitter and a photo detector disposed on a carrier. In some applications, the optical module and other electronic components (either SMT devices or non-SMT devices) may be integrated into a semiconductor device package. In a comparative semiconductor device package, the light emitter and the photo detector are disposed on the carrier to form the optical module and then the optical module and the electronic components are disposed on another carrier. Process for manufacturing the optical module and the semiconductor device package may be relatively complex and expensive. Moreover, the semiconductor device package may have relatively great size (e.g., thickness). It is desirable to integrate the light emitter, the photo detector and other electronic components into a single semiconductor device package.

SUMMARY

In accordance with an aspect of the present disclosure, a semiconductor device package includes a substrate, a first encapsulant and a second encapsulant. The substrate has an optical region and a surface-mount technology (SMT) device region. The first encapsulant includes a first portion disposed on the optical region and covers the optical region and a second portion disposed on the SMT device region and covers the SMT device region. The second encapsulant is disposed on the substrate and covers at least a portion of the second portion of the first encapsulant and a portion of the first portion of the first encapsulant.

In accordance another aspect of the present disclosure, a semiconductor device package includes a substrate, a first encapsulant and a second encapsulant. The substrate has a SMT device region on a top surface of the substrate. The first encapsulant includes a first portion disposed on a portion of the top surface of the substrate and a second portion spaced apart from the first portion and covering the SMT device region. The second encapsulant exposes the first portion of the first encapsulant and encapsulates at least a portion of the second portion of the first encapsulant.

In accordance another aspect of the present disclosure, a method of manufacturing the semiconductor device package is provided. The method includes (a) providing a substrate including a first surface and a second surface opposite to the first surface, the substrate having a first region on the first surface and a second region on the first surface, the first region spaced apart from the second region; (b) printing a solder material on the first region of the substrate; (c) disposing a SMT device on the solder material; and (d) forming a first encapsulant to encapsulate the second region.

2

DETAILED DESCRIPTION

Figure 1:
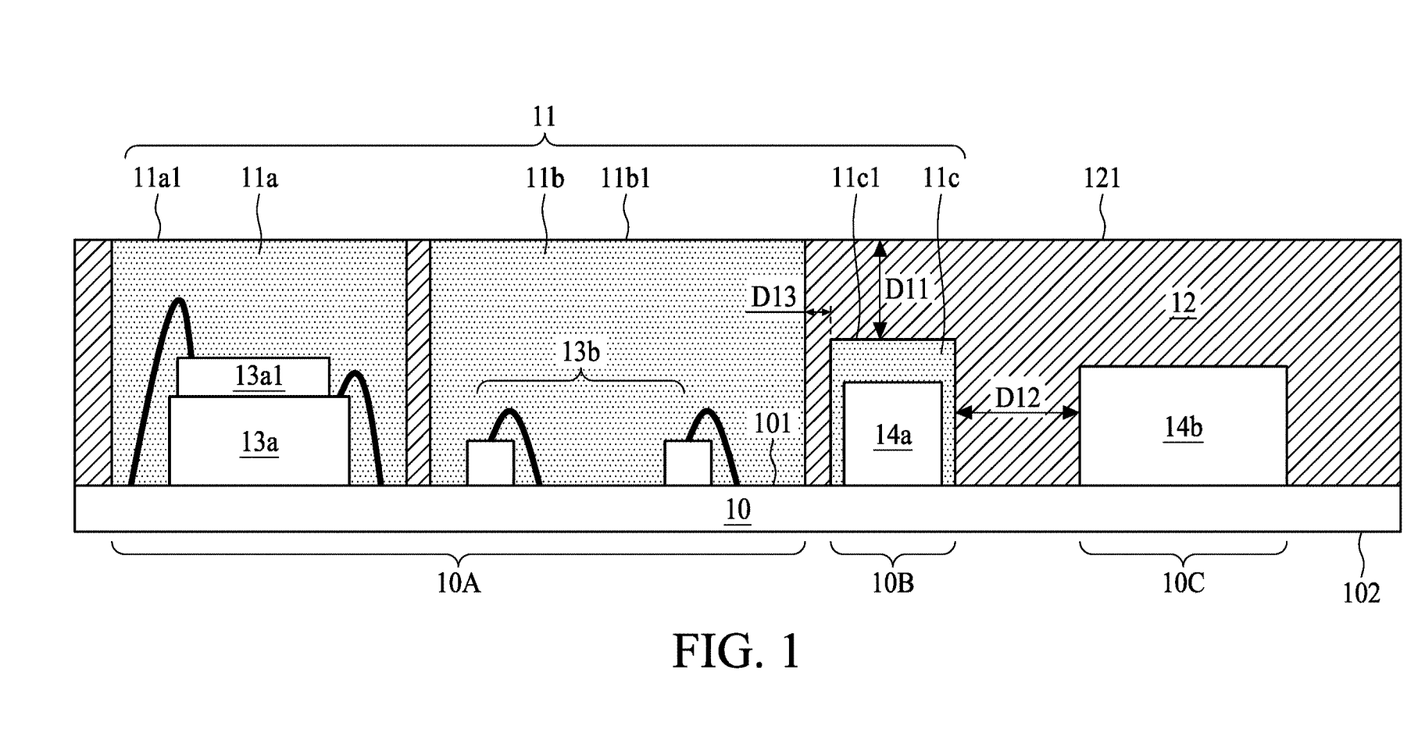
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a carrier 10, a first encapsulant 11, a second encapsulant 12, optical electronic components 13a, 13b and electronic components 14a, 14b.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, such as a plurality of conductive traces or a through via. In some embodiments, the carrier 10 includes a ceramic material or a metal plate. In some embodiments, the carrier 10 may include a substrate, such as an organic substrate or a leadframe. In some embodiments, the carrier 10 may include a two-layer substrate which includes a core layer and a conductive material and/or structure disposed on an upper surface and a bottom surface of the carrier 10. The conductive material and/or structure may include a plurality of traces.

The carrier 10 has a surface 101 (also referred to as "first surface" or "top surface") and a surface 102 (also referred to as "first surface" or "top surface") opposite to the surface 101. In some embodiments, the surface 101 of the carrier 10 has or is divided into a first region 10A (or "optical region"), a second region 10B (or "surface-mount technology (SMT) region") and a third region 10C (or "non-SMT region"). In some embodiments, the first region 10A, the second region 10B and the third region 10C do not overlap. As shown in FIG. 1, the second region 10B is between the first region 10A and the third region 10C.

The optical electronic component 13a is disposed on the carrier 10. In some embodiments, the optical electronic component 13a is disposed on the first region 10A of the carrier 10. The optical electronic component 13a may include a light detector which is, for example, a PIN diode (a diode including a p-type semiconductor region, an intrinsic semiconductor region, and an n-type semiconductor region) or a photo-diode or a photo-transistor. The optical electronic component 13a can be connected to the carrier 10, for example, by way of flip-chip or wire-bond techniques. The optical electronic component 13a has an active region (or light detecting area) 13a1 facing upwardly.

The optical electronic component 13b is disposed on the carrier 10. In some embodiments, the optical electronic component 13b is disposed on the first region 10A of the carrier 10 and adjacent to the optical electronic component 13a. The optical electronic component 13b may include emitting dies or other optical dies. For example, the optical electronic component 13b may include light-emitting diodes (LEDs), laser diodes, or another device that may include one or more semiconductor layers. The semiconductor layers may include silicon, silicon carbide, gallium nitride, or any other semiconductor materials. The optical electronic component 13b can be connected to the carrier 10 by way of flip-chip or wire-bond techniques, for example. In some embodiments, the optical electronic component 13b includes an LED die bonded on the carrier 10 via a die bonding material. The LED die includes at least one wire-bonding pad. The LED die is electrically connected to the carrier 10 by a conductive wire, one end of which is bonded to the wire-bonding pad of the LED die and another end of which is bonded to a wire-bonding pad of the carrier 10.

The electronic component 14a is disposed on the carrier 10. In some embodiments, the electronic component 14a is disposed on the second region 10B of the carrier 10. The electronic component 14a may be a SMT device. For example, the electronic component 14a may be a passive electrical component, such as a capacitor, a resistor or an inductor. The electronic component 14a may be electrically connected to the carrier 10 (e.g., to the RDL) by way of flip-chip or wire-bond techniques.

The electronic component 14b is disposed on the carrier 10. In some embodiments, the electronic component 14b is disposed on the third region 10C of the carrier 10. The electronic component 14b may be a non-SMT device. For example, the electronic component 14b may be a microcontroller unit (MCU), analog front end (AFE), and the like.

The first encapsulant 11 is disposed on the carrier 10 and covers the optical electronic components 13a, 13b and the electronic component 14a. For example, the first encapsulant 11 has a portion 11a disposed on the first region 10A of the carrier 10 to cover the optical electronic component 13a, a portion 11b disposed on the first region 10A of the carrier 10 to cover the optical electronic component 13b and a portion 11c disposed on the second region 10B of the carrier to cover the electronic component 14a. In some embodiments, the first encapsulant 11 is formed of or includes light transmitting material (e.g., an epoxy resin). For example, the first encapsulant 11 is a clear molding compound.

In some embodiments, a top surface 11a1 of the portion 11a of the first encapsulant 11 is substantially coplanar with a top surface 11b1 of the portion 11b of the first encapsulant 11. In some embodiments, a top surface 11c1 of the portion 11c of the first encapsulant 11 is lower than the top surface 11a1 of the portion 11a of the first encapsulant 11 or the top surface 11b1 of the portion 11b of the first encapsulant 11. For example, a distance D11 between the top surface 11c1 of the portion 11c of the first encapsulant 11 and the top surface 11a1 of the portion 11a of the first encapsulant 11 or the top surface 11b1 of the portion 11b of the first encapsulant 11 is equal to or greater than about 100 micrometer (μm). The portion 11c of the first encapsulant 11 is spaced apart from the electronic component 14b in a distance D12. In some embodiments, the distance D12 is equal to or greater than 1000 μm.

The second encapsulant 12 is disposed on the carrier 10 to cover the portion 11c of the first encapsulant 11 and the electronic component 14b. In some embodiments, the second encapsulant 12 is disposed between the portion 11a of the first encapsulant 11 and the portion 11b of the first encapsulant 11 to separate the portion 11a of the first encapsulant 11 from the portion 11b of the first encapsulant 11. In some embodiments, the second encapsulant 12 is also disposed between the portion 11b of the first encapsulant 11 and the portion 11c of the first encapsulant 11 to separate the portion 11b of the first encapsulant 11 from the portion 11c of the first encapsulant 11. In some embodiments, a thickness D13 of the second encapsulant 12 between the portion 11b of the first encapsulant 11 and the portion 11c of the first encapsulant 11 is equal to or greater than 100 μm. In some embodiments, the thickness D12 of the second encapsulant 12 between the portion 11b of the first encapsulant 11 and the portion 11c of the first encapsulant 11 is equal to or greater than 1000 μm. In some embodiments, a top surface 121 of the second encapsulant 12 is substantially coplanar with the top surface 11a1 of the portion 11a of the first encapsulant 11 or the top surface 11b1 of the portion 11b of the first encapsulant 11. In some embodiments, the second encapsulant 12 is formed of light block materials or light absorbing materials. For example, the second encapsulant 12 is formed of or includes black molding compound. In some embodiments, the second encapsulant 12 includes filler, e.g., silica filler. Therefore, a portion of the second encapsulant 12 between the portion 11a and the portion 11b of the first encapsulant 11 can act as a barrier wall to prevent undesired light emitted by the optical electronic component 13b from directly entering the optical electronic component 13a.

In a comparative semiconductor device package including a light emitter, a photo detector and other electronic components (e.g., SMT devices or non-SMT devices), the light emitter and the photo detector are disposed on a carrier to form an optical module and then the optical module and other electronic components are disposed on another carrier, which would increase the manufacturing cost and the thickness of the semiconductor device package. In accordance with the embodiments in FIG. 1, since the optical electronic components 13a, 13b (e.g., a light emitter and a photo detector) and electronic components (e.g., SMT device or non-SMT device) are directly disposed on the carrier 10 without using an additional carrier, the manufacturing cost and the thickness of the semiconductor device package 1 can be reduced.

Figure 2:
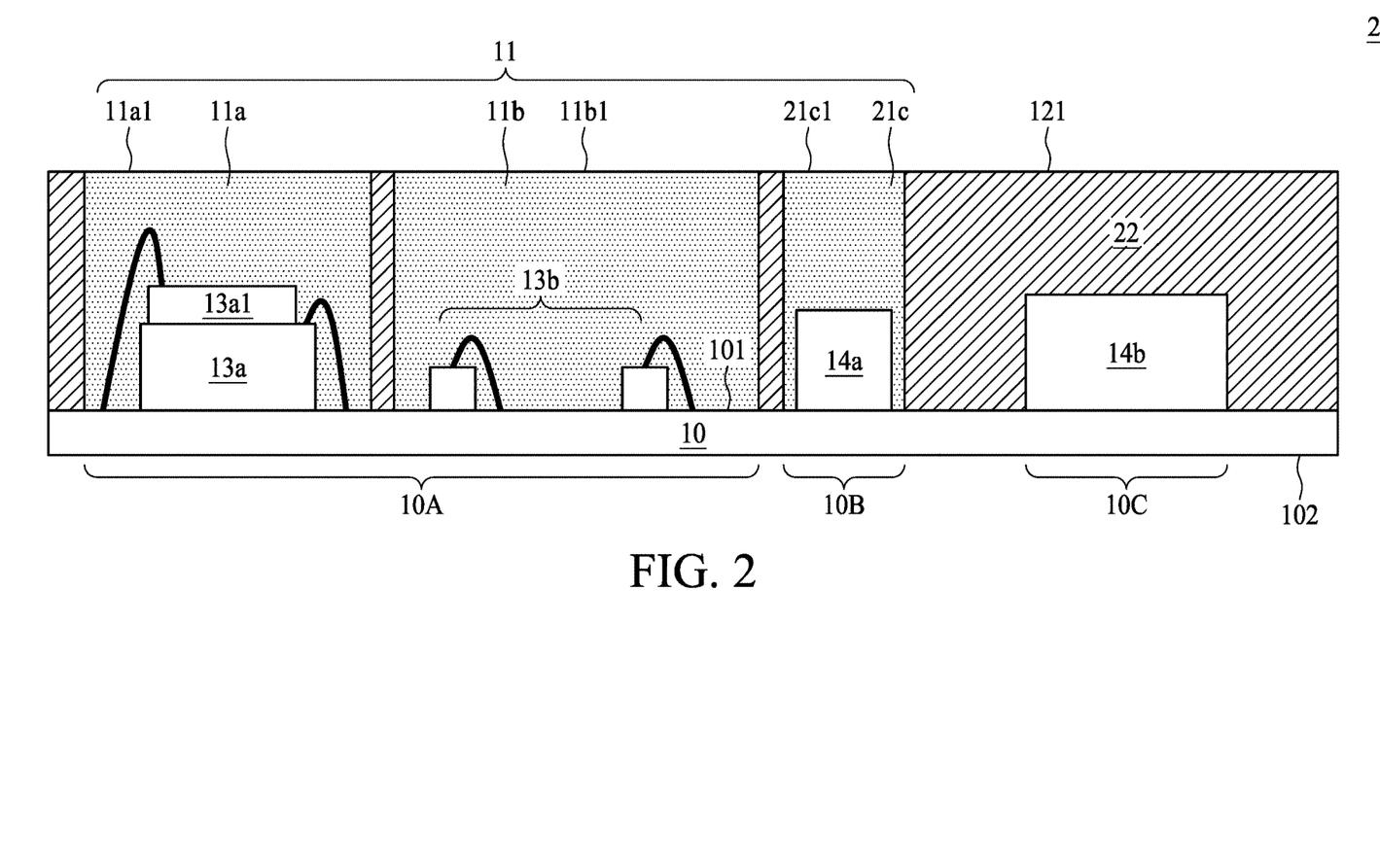
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1 except that in FIG. 2, a top surface 21c1 of the portion 21c of the first encapsulant 11 covering the electronic component 14a is substantially coplanar with the top surface 11a1 of the portion 11a of the first encapsulant 11 or the top surface 11b1 of the portion 11b of the first encapsulant 11. For example, the second encapsulant 22 does not cover the top surface 21c1 of the portion 21c of the first encapsulant 11.

Figure 3:
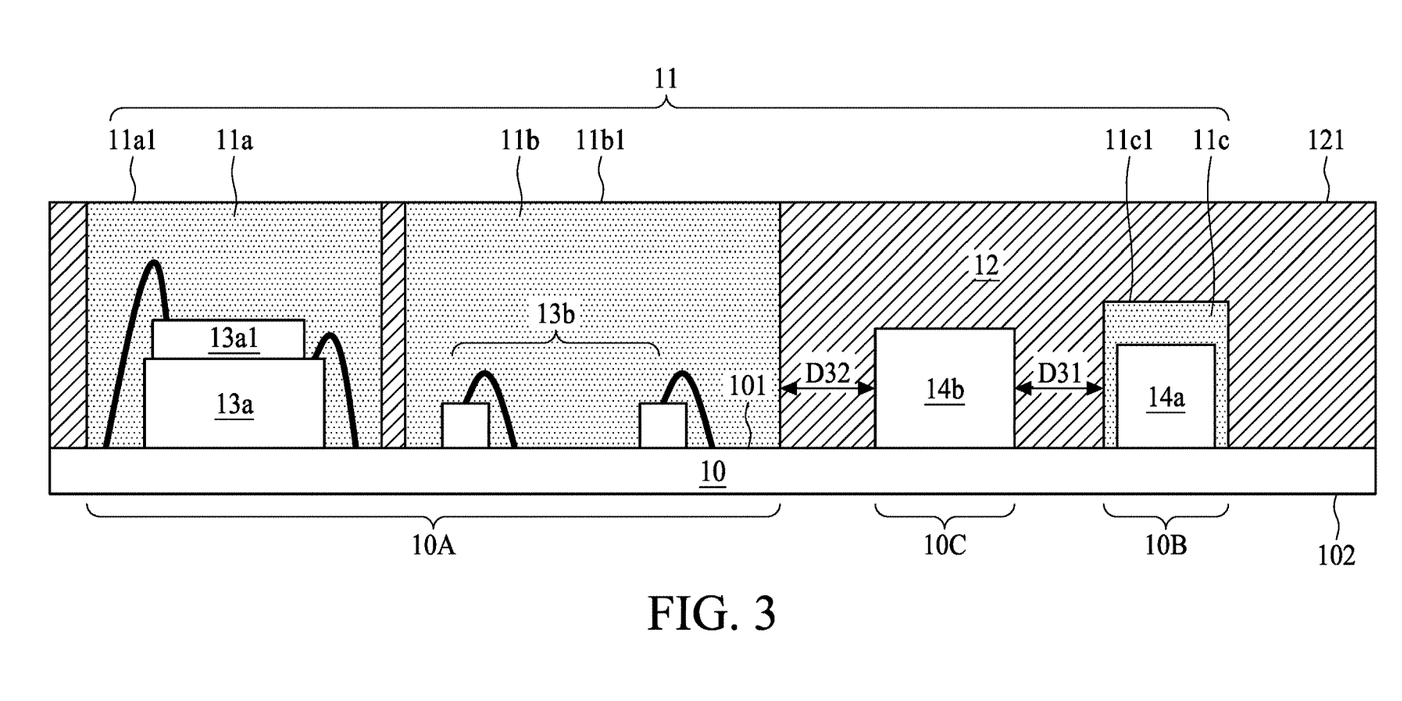
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1, and the difference between includes that in FIG. 1, the electronic component 14a is disposed between the electronic component 14b and the optical electronic component 13b while in FIG. 3, the electronic component 14b is disposed between the electronic component 14a and the optical electronic component 13b. For example, in FIG. 1, the second region 10B is between the first region 10A and the third region while in FIG. 3, the third region 10C is between the first region 10A and the second region 10B. The portion 11c of the first encapsulant 11 is spaced apart from the electronic component 14b in a distance D31. In some embodiments, the distance D31 is equal to or greater than 1000 μm. The portion 11b of the first encapsulant 11 is spaced apart from the electronic component 14b in a distance D32. In some embodiments, the distance D32 is equal to or greater than 1000 μm.

Figure 4A:
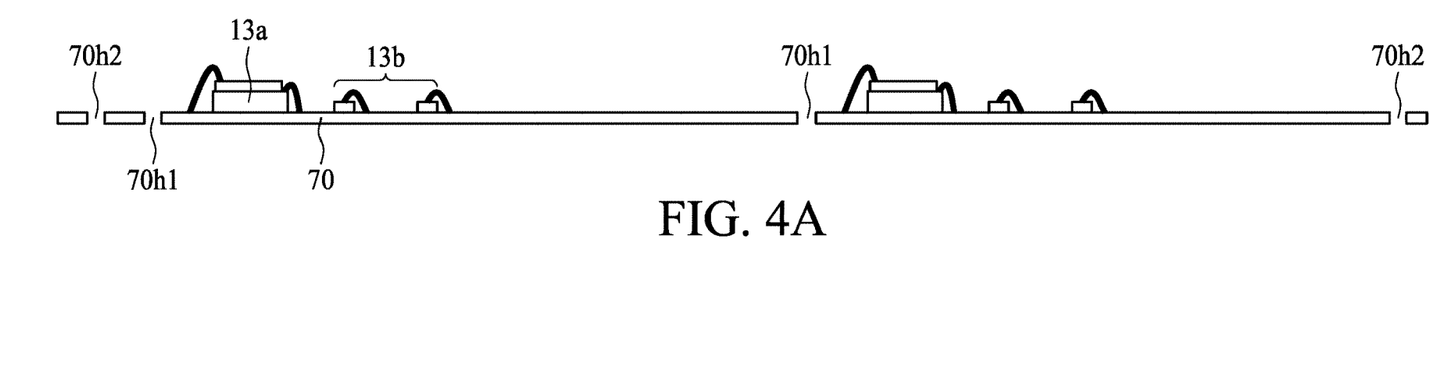
FIG. 4A, FIG. 4B, FIG. 4C, FIG. 4D, FIG. 4D' and FIG. 4E illustrate a method for manufacturing a semiconductor device package in accordance with some embodiments of the present disclosure.
Figure 4B:
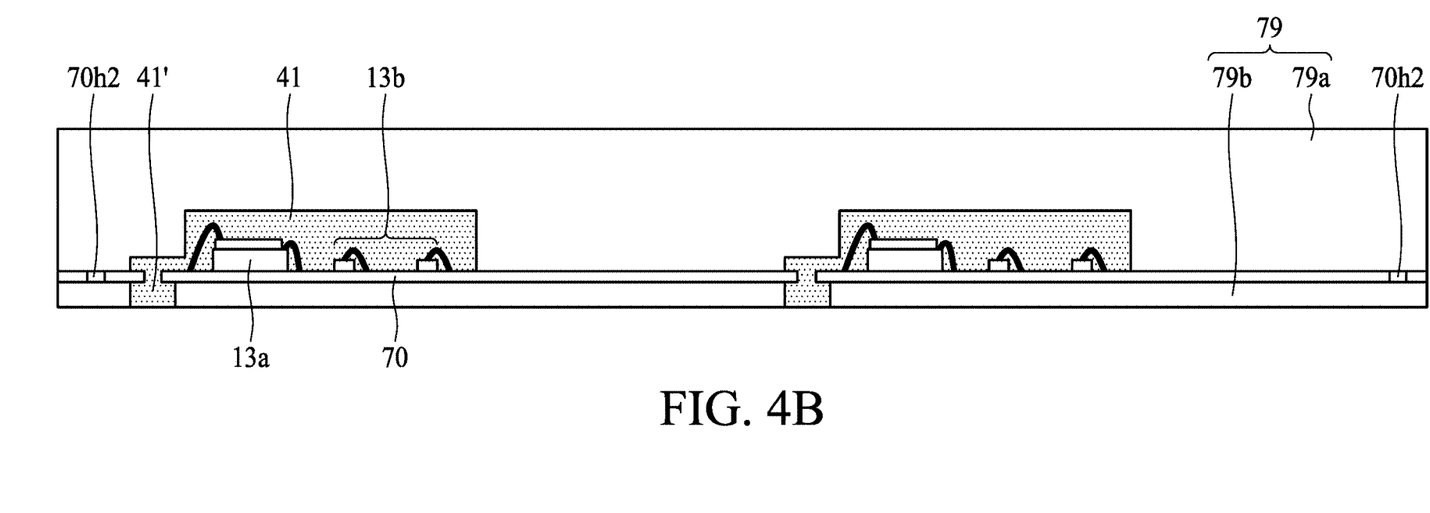
Figure 4C:
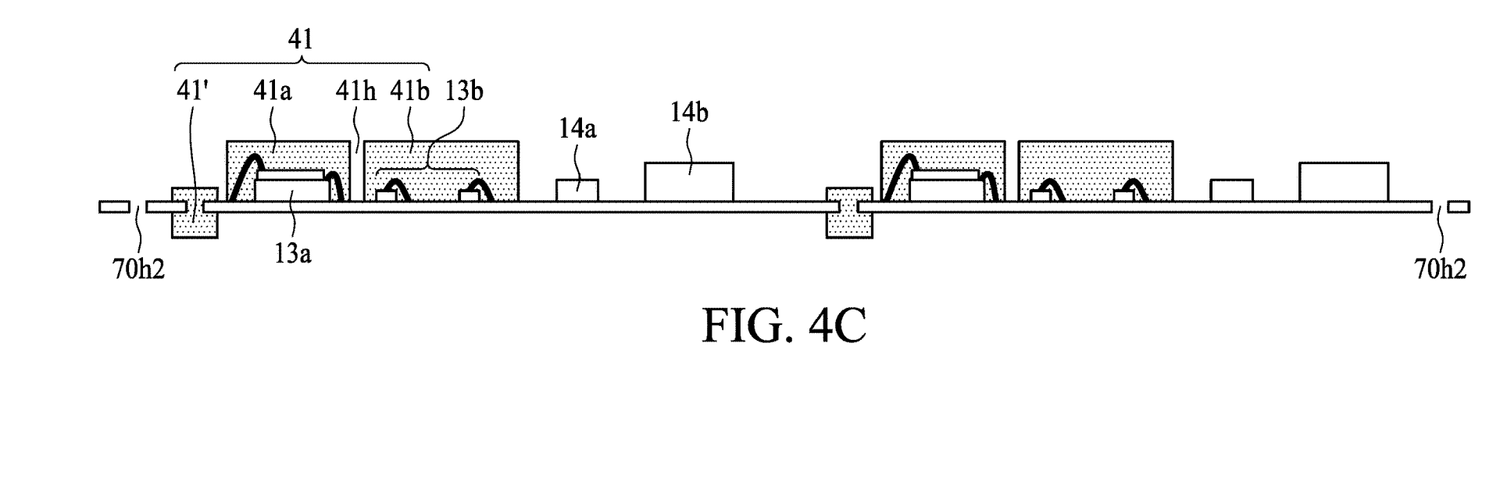
Figure 4D:
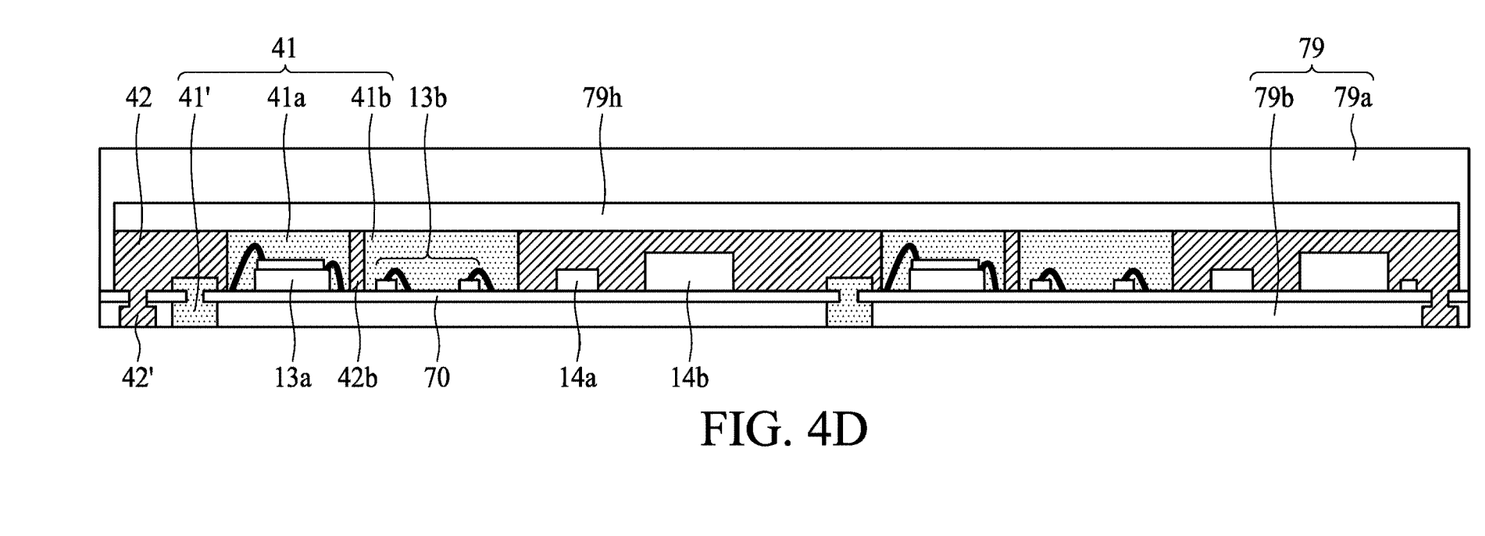
Figure 4E:
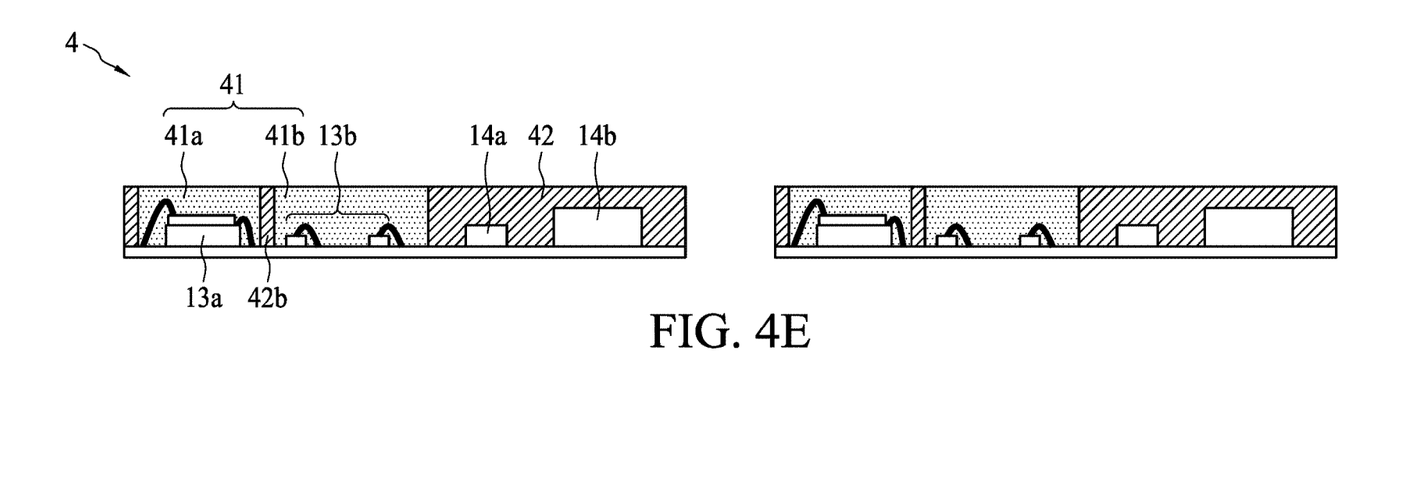

FIG. 4A, FIG. 4B, FIG. 4C, FIG. 4D, FIG. 4D' and FIG. 4E illustrate a method for manufacturing a semiconductor device package in accordance with some embodiments of the present disclosure. Although some processes, operations or steps are described in the following with respect to each of a plurality of components, any of those processes, operations or steps may be selectively performed with respect to one of the plurality of components, or with respect to some number in between one and the full plurality of components.

Referring to FIG. 4A, a carrier strip (or panel) including a carrier 70 is provided. The carrier strip includes a plurality of openings 70h1, 70h2 at predetermined locations to penetrate the carrier strip. The optical electronic component 13a (e.g., a light detector) and the optical electronic component 13b (e.g., a light emitter) are placed on the carrier 10 and electrically connected to the carrier by way of flip-chip or wire-bond techniques. The optical electronic component 13a and the optical electronic component 13b are physically separated from each other.

Referring to FIG. 4B, the carrier strip is disposed within a molding chamber 79 and sandwiched by an upper molding chase 79a and a lower molding chase 79b. The upper molding chase 79a and the lower molding chase 79b define a space to accommodate the optical electronic components 13a and 13b. Then, a molding process is carried out to form an encapsulant 41 to cover the optical electronic components 13a and 13b. In some embodiments, the encapsulant 41 can be formed by using selective molding process. A portion 41' of the encapsulant 41 is formed within the opening 70h1 and a bottom surface of the carrier strip to act as a runner (or dummy runner), which would prevent the carrier strip from being warpage. In some embodiments, the encapsulant 41 is formed of or includes light transmitting material (e.g., an epoxy resin). For example, the encapsulant 41 is a clear molding compound.

Referring to FIG. 4C, the carrier strip with the encapsulant 41 is removed from the molding chamber 79. A portion of the encapsulant 41 between the optical electronic component 13a and the optical electronic component 13b is removed by a cutting operation (e.g., half-cut operation) to form an opening 41h. For example, the encapsulant 41 is divided into a portion 41a covering the optical electronic component 13a and a portion 41b covering the optical electronic component 13b. The portion 41a and the portion 41b are physically spaced apart from each other.

The electronic components 14a and 14b are then disposed on the carrier strip. In some embodiments, solder materials can be dispensed on the carrier strip and the electronic component (e.g., SMT device) 14a is disposed on the solder materials. In other embodiments, solder materials can be disposed on the carrier strip by using a three-dimensional (3D) stencil, and the electronic component 14a is disposed on the solder materials. The electronic component 14b (e.g., non-SMT device) is disposed on the carrier strip by dipping ball grid array (BGA).

Referring to FIG. 4D, the structure in FIG. 4C is disposed within the molding chamber 79 and sandwiched by the upper molding chase 79a and the lower molding chase 79b. The upper molding chase 79a and the lower molding chase 79b define a space to accommodate the electronic components 14a, 14b and the encapsulant 41 covering optical electronic components 13a and 13b. The molding chamber 79 may include a release film 79h attached to the encapsulant 41. Then, a molding process is carried out to form an encapsulant 42 to cover the electronic components 14a and 14b. A portion 42' of the encapsulant 42 is formed within the opening 70h2 and a bottom surface of the carrier strip to act as a runner (or dummy runner), which would prevent the carrier strip from being warpage. A portion 42b of the encapsulant 42 is disposed within the opening 41h between the portion 41a of the encapsulant 41 and the portion 41b of the encapsulant 41. In some embodiments, the encapsulant 42 is formed of light block materials or light absorbing materials. For example, the encapsulant 42 is formed of or includes black molding compound.

In some embodiments, the modulus of the encapsulant 41 is about 3200 N/mm$^2$ and the modulus of the encapsulant 42 is in a range from about 13000 N/mm$^2$ to about 23000 N/mm$^2$. Since the modulus of the encapsulant 41 is much smaller than that of the encapsulant 42, a high warpage would occur at carrier 70 without the runner structures as shown in FIG. 4C and FIG. 4D. Furthermore, since the modulus of the encapsulant 41 is much smaller than that of the encapsulant 42, an internal stress of the encapsulant 41 is much smaller than that of the encapsulant 42 so that the encapsulant 41 may endure a warpage of the carrier 70 more than the encapsulant 42 to prevent delamination between the encapsulant 41 and the carrier 70.

In accordance with the embodiments as shown in FIG. 4D', which illustrates a bottom view of the structure in FIG. 4D, the portion 42' of the encapsulant 42 is disposed at along the edges of the bottom surface of the carrier strip, and the portion 41' of the encapsulant 41 is disposed on the bottom surface of the carrier strip and adjacent to the location where the optical electronic component 13a is disposed. The portion 41' of the encapsulant 41 and the portion 42' of the encapsulant 42 are used as runner structures to prevent the carrier strip from being warpage or delamination during the manufacturing processes.

Referring to FIG. 4E, the carrier strip is removed from the molding chamber 79, and then singulation may be performed to separate out individual semiconductor device packages including the semiconductor device package 4. That is, the singulation is performed through the encapsulant 42 and the carrier strip including the carrier 70. The singulation may be performed, for example, by using a dicing saw, laser or other appropriate cutting technique. The semiconductor device package 4 is similar to the semiconductor device package 1 in FIG. 1 except that in FIG. 4, the electronic component 14a is not covered by a clear compound (e.g., the encapsulant 41). For example, the electronic component 14a is directly covered by the encapsulant 42.

FIG. 5A, FIG. 5B, FIG. 5C, FIG. 5D and FIG. 5E illustrate a method for manufacturing a semiconductor device package in accordance with some embodiments of the present disclosure. Although some processes, operations or steps are described in the following with respect to each of a plurality of components, any of those processes, operations or steps may be selectively performed with respect to one of the plurality of components, or with respect to some number in between one and the full plurality of components.

Figure 5A:
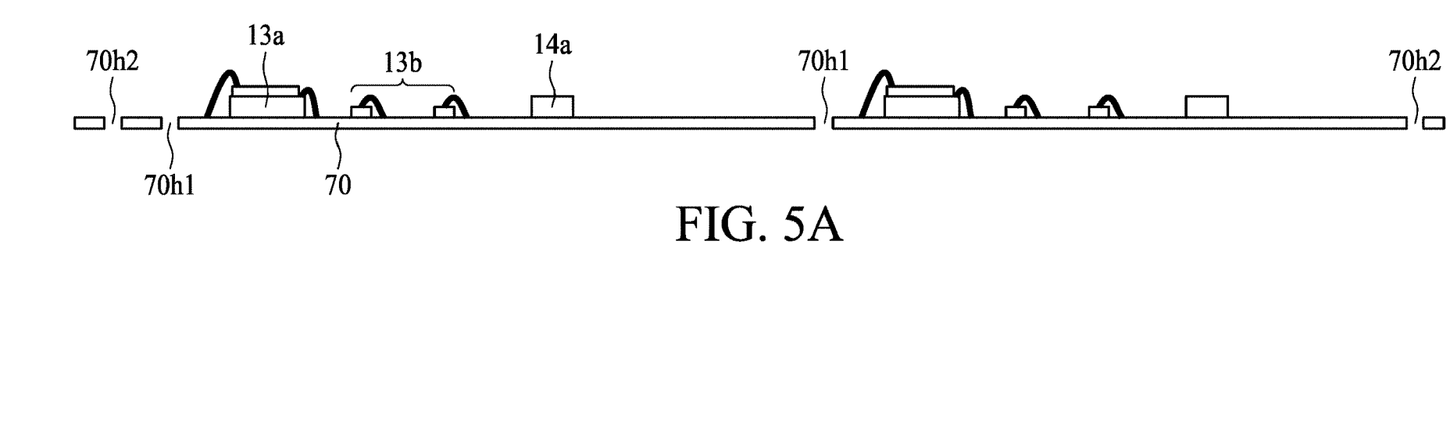
FIG. 5A, FIG. 5B, FIG. 5C, FIG. 5D and FIG. 5E illustrate a method for manufacturing a semiconductor device package in accordance with some embodiments of the present disclosure.

Referring to FIG. 5A, a carrier strip (or panel) including a carrier 70 is provided. The carrier strip includes a plurality of openings 70h1, 70h2 at predetermined locations to penetrate the carrier strip. The electronic component 14a is disposed on the carrier strip. For example, electrical connects (e.g., solder materials) can be printed on the carrier strip, and then the electronic component 14a is mounted of the electrical contacts through SMT technique. The optical electronic component 13a (e.g., a light detector) and the optical electronic component 13b (e.g., a light emitter) are placed on the carrier 10 and electrically connected to the carrier by way of flip-chip or wire-bond techniques. The optical electronic component 13a and the optical electronic component 13b are physically separated from each other. In some embodiments, the electronic component 14a is mounted on the carrier strip before the optical electronic component 13a, 13b.

Figure 5B:
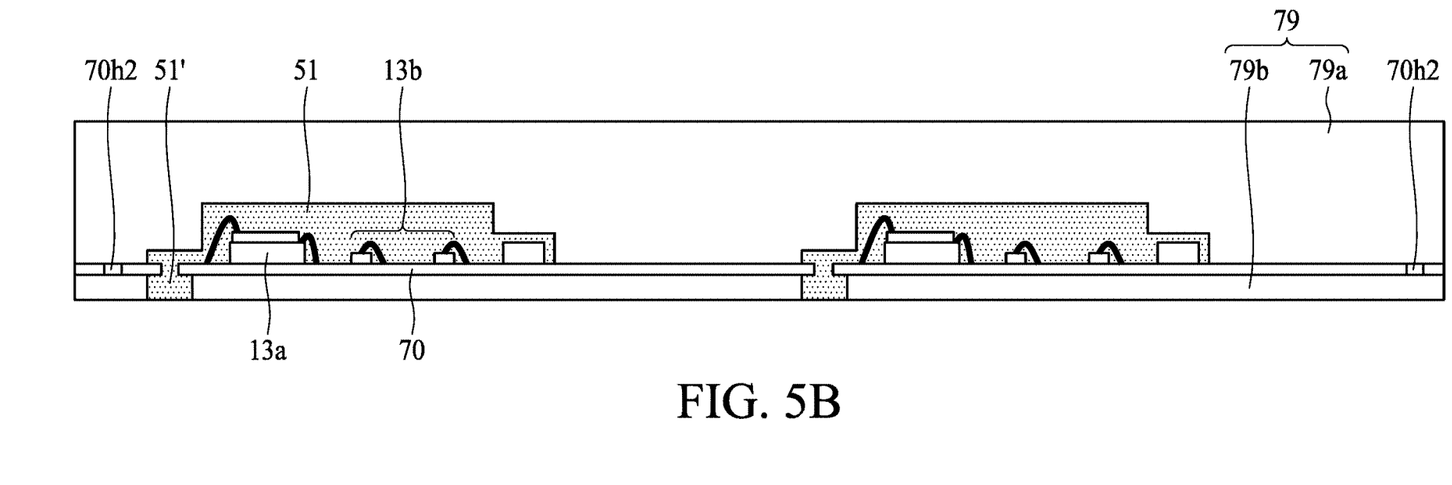

Referring to FIG. 5B, the carrier strip is disposed within a molding chamber 79 and sandwiched by an upper molding chase 79a and a lower molding chase 79b. The upper molding chase 79a and the lower molding chase 79b define a space to accommodate the optical electronic components 13a, 13b and the electronic component 14a. Then, a molding process is carried out to form an encapsulant 51 to cover the optical electronic components 13a, 13b and the electronic component 14a. In some embodiments, the encapsulant 51 can be formed by using selective molding process. A portion 51' of the encapsulant 51 is formed within the opening 70h1 and a bottom surface of the carrier strip to act as a runner (or dummy runner), which would prevent the carrier strip from being warpage. In some embodiments, the encapsulant 51 is formed of or includes light transmitting material (e.g., an epoxy resin). For example, the encapsulant 51 is a clear molding compound.

Figure 5C:
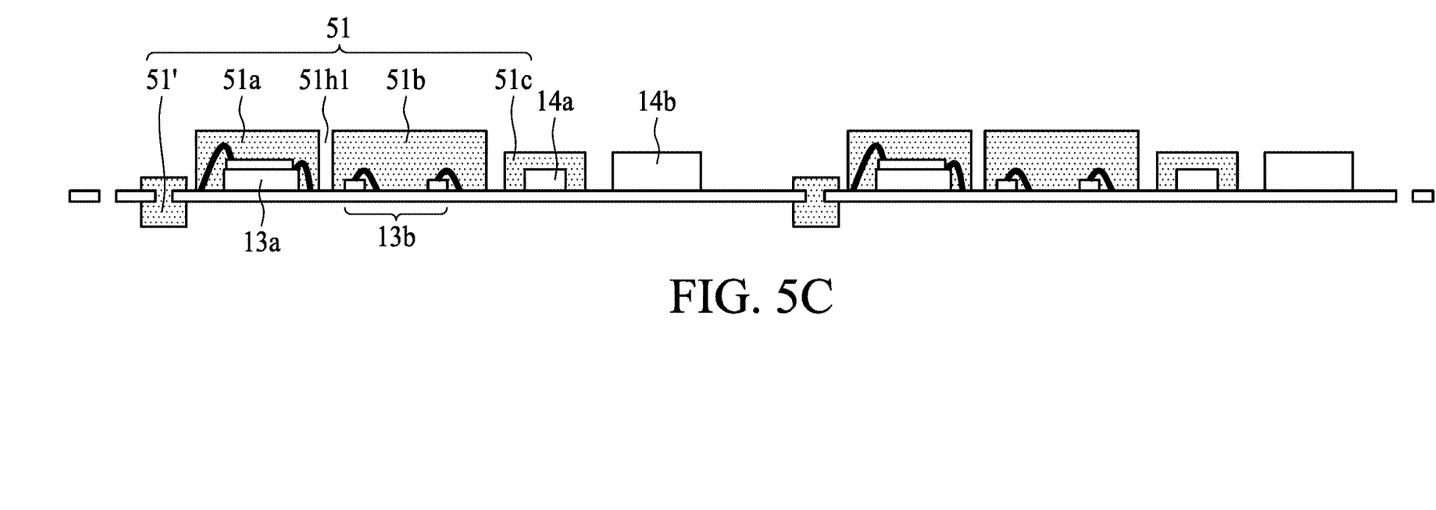

Referring to FIG. 5C, the carrier strip with the encapsulant 51 is removed from the molding chamber 79. A portion of the encapsulant 51 between the optical electronic component 13a and the optical electronic component 13b and a portion of the encapsulant 51 between the optical electronic component 13b and the electronic component 14a are removed by a cutting operation (e.g., half-cut operation) to form openings 51h1 and 51h2. For example, the encapsulant 51 is divided into a portion 51a covering the optical electronic component 13a, a portion 51b covering the optical electronic component 13b and a portion 51c covering the electronic component 14a. The portion 51a and the portion 51b or the portion 51b and the portion 51c are physically spaced apart from each other. The electronic component 14b then disposed on the carrier strip. The electronic component 14b (e.g., non-SMT device) is disposed on the carrier strip by BGA.

Figure 5D:
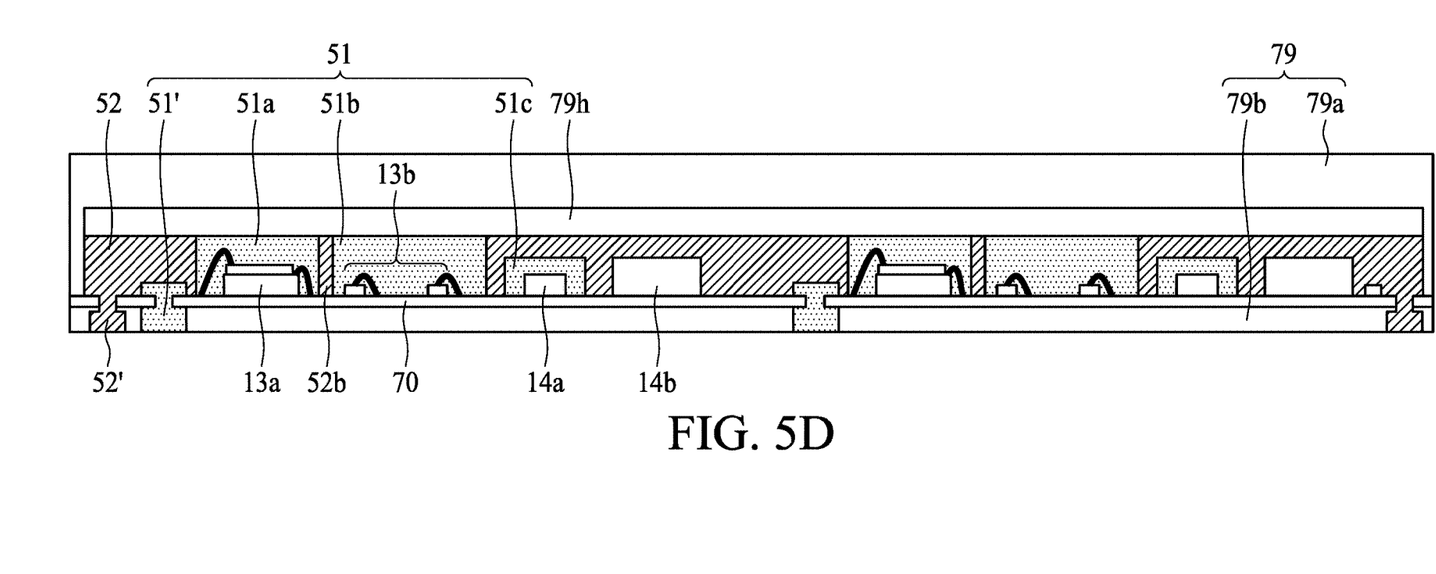

Referring to FIG. 5D, the structure in FIG. 5C is disposed within the molding chamber 79 and sandwiched by the upper molding chase 79a and the lower molding chase 79b. The upper molding chase 79a and the lower molding chase 79b define a space to accommodate the electronic component 14b and the portions 51a, 51b and 51c of the encapsulant 41 covering optical electronic components 13a, 13b and the electronic component 14a. The molding chamber 79 may include a release film 79h attached to the encapsulant 41. Then, a molding process is carried out to form an encapsulant 52 to cover the electronic component 14b and the portion 51c of the encapsulant 51. A portion 52' of the encapsulant 52 is formed within the opening 70h2 and a bottom surface of the carrier strip to act as a runner (or dummy runner), which would prevent the carrier strip from being warpage. A portion 52b of the encapsulant 52 is disposed within the opening 51h1 between the portion 51a of the encapsulant 51 and the portion 51b of the encapsulant 51. In some embodiments, the encapsulant 52 is formed of light block materials or light absorbing materials. For example, the encapsulant 52 is formed of or includes black molding compound. In some embodiments, the bottom view of the structure in FIG. 5D is similar to the structure in FIG. 4D'.

Figure 5E:
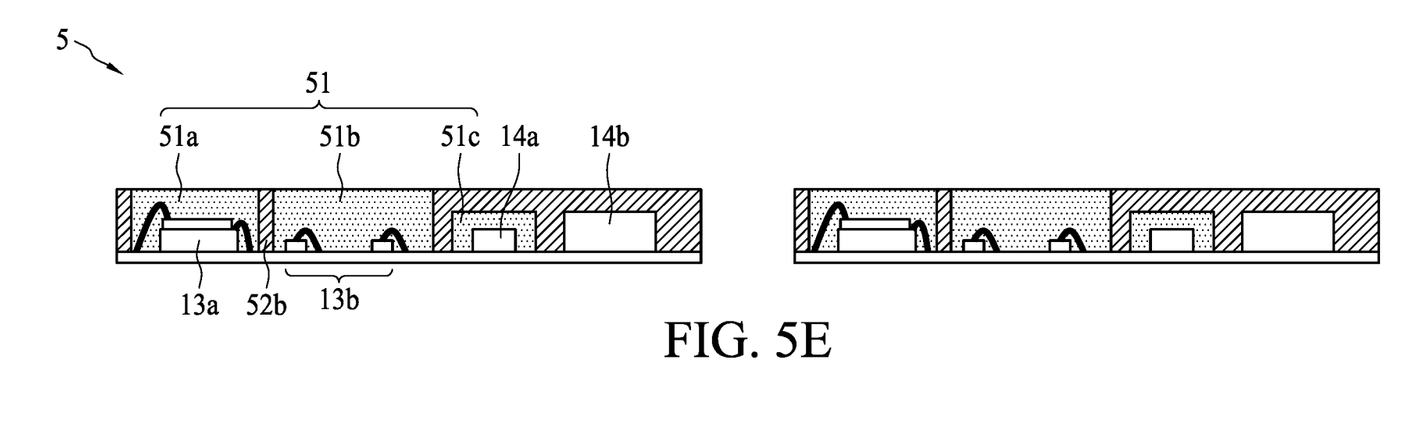

Referring to FIG. 5E, the carrier strip is removed from the molding chamber 79, and then singulation may be performed to separate out individual semiconductor device packages including the semiconductor device package 5. That is, the singulation is performed through the encapsulant 52 and the carrier strip including the carrier 70. The singulation may be performed, for example, by using a dicing saw, laser or other appropriate cutting technique. The semiconductor device package 5 is similar to the semiconductor device package 1 in FIG. 1.

In accordance with the embodiments in FIG. 4C, the electronic component 14a (e.g., SMT device) is disposed on the carrier strip subsequent to the formation of the encapsulant 41, and thus the solder material for connecting the electronic component 14a to the carrier strip is formed by dispensing or 3D stencil. However, forming the solder material by dispensing would increase the manufacturing time. In addition, it is difficult to control spacer tolerance between the encapsulant 41 and the 3D stencil, which would increase the manufacturing cost. In accordance with the embodiment in FIG. 5A, the electronic component 14a (e.g., SMT device) is disposed on the carrier strip prior to the formation of the encapsulant 41 and the optical electronic components 13a and 13b, and thus the solder material for connecting the electronic component 14a to the carrier strip can be formed by printing process and can be formed along with other conductive pads, which would reduce the time, cost and complexity for manufacturing the semiconductor device package.

Figure 6:
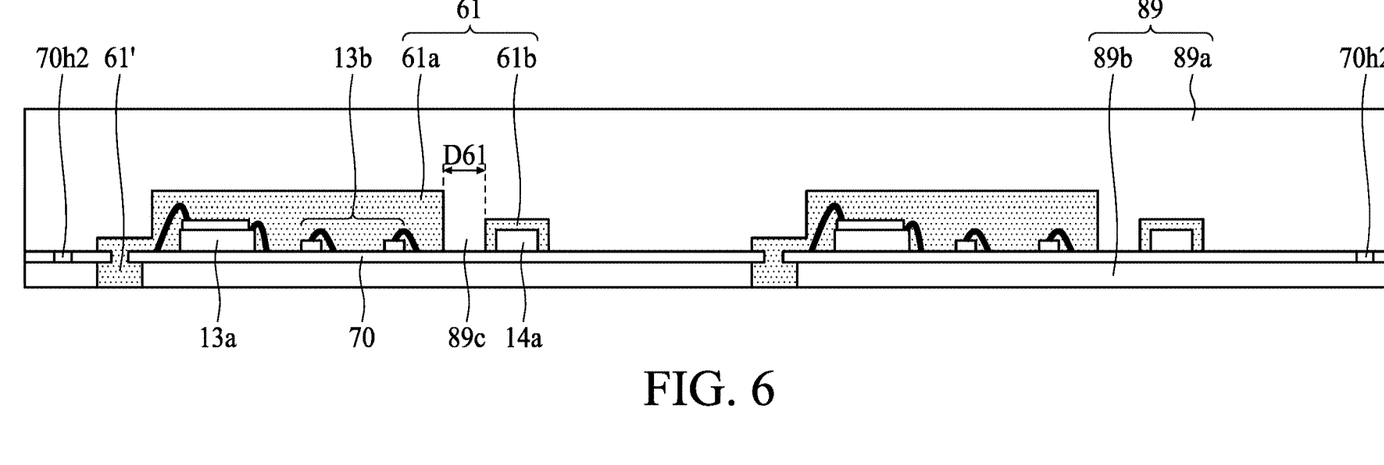
FIG. 6 illustrates a method for manufacturing a semiconductor device package in accordance with some embodiments of the present disclosure.

FIG. 6 illustrates a method for manufacturing a semiconductor device package in accordance with some embodiments of the present disclosure. The operation in FIG. 6 is carried out subsequent to the operation in FIG. 5A. The carrier strip in FIG. 5A is disposed within a molding chamber 89 and sandwiched by an upper molding chase 89a and a lower molding chase 89b. The molding chamber 89 is similar to the molding chamber 79 in FIG. 5B except that the molding chamber 89 further includes a block structure 89c to separate the electronic component 14a from the optical electronic component 13b. Therefore, after removing the carrier strip from the molding chamber 89, a gap (or opening) will be formed between the optical electronic component 13b and electronic component 14a without a further cutting process. For example, the encapsulant 61 has a portion 61a covering the optical electronic components 13a and 13b and a portion 61b covering the electronic component 14a. The portion 61a of the encapsulant 61 is physically spaced apart from the portion 61b of the encapsulant 61. In some embodiments, a width D61 of the block structure 89c is equal to or greater than 1000 μm. In some embodiments, a distance between the portion 61b of the encapsulant and any other conductive pads on the carrier strip is equal to or greater than 1000 μm. After the operation in FIG. 6 is completed, the carrier strip is removed from the molding chamber 89, and then the operations in FIG. 5C, FIG. 5D and FIG. 5E are carried out to form the semiconductor device package as shown in FIG. 1.

Figure 7:
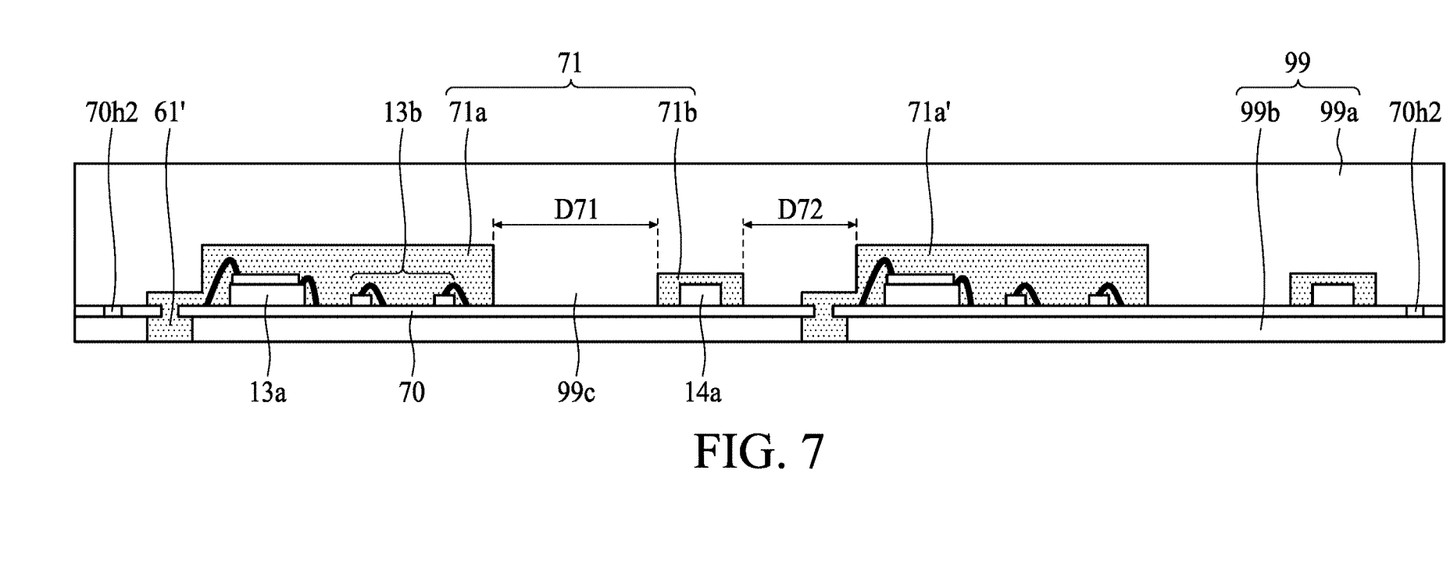
FIG. 7 illustrates a method for manufacturing a semiconductor device package in accordance with some embodiments of the present disclosure Common reference numerals are used throughout the drawings and the detailed description to indicate the same or similar components. The present disclosure can be best understood from the following detailed description taken in conjunction with the accompanying drawings.

FIG. 7 illustrates a method for manufacturing a semiconductor device package in accordance with some embodiments of the present disclosure. The operation in FIG. 7 is carried out subsequent to the operation in FIG. 5A. The carrier strip in FIG. 5A is disposed within a molding chamber 99 and sandwiched by an upper molding chase 99a and a lower molding chase 99b. The molding chamber 99 is similar to the molding chamber 89 in FIG. 6 except that a width D71 of the molding chamber 99 is greater than the width D61 of the molding chamber 89 because an electronic component (e.g., non-SMT device) will be disposed between the electronic component 14a and the optical electronic component 13b in the following processes.

After removing the carrier strip from the molding chamber 99, a gap (or opening) will be formed between the optical electronic component 13b and electronic component 14a without a further cutting process. For example, the encapsulant 71 has a portion 71a covering the optical electronic components 13a and 13b and a portion 71b covering the electronic component 14a. The portion 71a of the encapsulant 71 is physically spaced apart from the portion 71b of the encapsulant 71. In some embodiments, a distance D72 between the portion 71b of the encapsulant 71 and the portion 71a' of the encapsulant is equal to or greater than 1000 μm. In some embodiments, a distance between the portion 71b of the encapsulant and any other conductive pads on the carrier strip is equal to or greater than 1000 μm. After the operation in FIG. 7 is completed, the carrier strip is removed from the molding chamber 99, and then the operations in FIG. 5C, FIG. 5D and FIG. 5E are carried out to form the semiconductor device package as shown in FIG. 3.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 within 30 within 20 within 10 or within 1 of lying along the same plane. Two components can be deemed to be "substantially aligned" if, for example, the two components overlap or are within 200 within 150 within 100 within 50 within 40 within 30 within 20 within 10 or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate having a SMT device region on a top surface of the substrate;
   a first encapsulant including a first portion disposed on a portion of the top surface of the substrate and a second portion spaced apart from the first portion and covering the SMT device region, wherein a top surface of the first portion is fully exposed from the second portion; and
   a second encapsulant exposing the first portion of the first encapsulant and encapsulating at least a portion of the second portion of the first encapsulant,
   wherein the top surface of the first portion of the first encapsulant is fully exposed from the second encapsulant.

2. The semiconductor device package of claim 1, wherein a portion of the second encapsulant is disposed between the first portion of the first encapsulant and the second portion of the first encapsulant.

3. The semiconductor device package of claim 2, wherein the second encapsulant includes a light absorbing material, and a thickness of the portion of the second encapsulant is greater than or equal to 100 μm.

4. The semiconductor device package of claim 1, wherein the thickness of the portion of the second encapsulant is greater than or equal to 1000 μm.

5. The semiconductor device package of claim 1, wherein the second encapsulant includes a light absorbing material, and a distance between an upper surface of the second encapsulant and an upper surface of the second portion of the first encapsulant is equal to or greater than 100 μm.

6. The semiconductor device package of claim 1, further comprising a non-SMT device region on the top surface of the substrate, wherein the non-SMT device is spaced apart from the first encapsulant and encapsulated by the second encapsulant.

7. The semiconductor device package of claim 6, wherein a distance between the SMT device region and the non-SMT device region is greater than or equal to 1000 μm.

8. The semiconductor device package of claim 1, wherein an upper surface of the second portion of the first encapsulant is covered by the second encapsulant.

9. The semiconductor device package of claim 1, wherein an upper surface of the second portion of the first encapsulant is exposed from the second encapsulant.

10. The semiconductor device package of claim 1, further comprising: an electronic component disposed on the substrate and spaced apart from the SMT device region by the second encapsulant and the second portion of the first encapsulant.

11. The semiconductor device package of claim 1, further comprising: a first optical component and a second optical component disposed on an optical region of the substrate, wherein the first optical component is a light emitter, and the first optical component is closer to the SMT device region than the second optical component.

12. The semiconductor device package of claim 1, further comprising: a first optical component and a second optical component disposed on an optical region of the substrate, wherein the first optical component is a light emitter, and the first optical component is disposed between the SMT device region and the second optical component.

* * * * *